(12) United States Patent
Hoenigschmid et al.

(10) Patent No.: US 6,624,461 B1
(45) Date of Patent: Sep. 23, 2003

(54) MEMORY DEVICE

(75) Inventors: Heinz Hoenigschmid, Essex Junction, NY (US); Georg Braun, Munich (DE)

(73) Assignee: Infineon Technologies Aktiengesellschaft, Munich (DE)

(*) Notice: Subject to any disclaimer, the term of this patent is extended or adjusted under 35 U.S.C. 154(b) by 0 days.

(21) Appl. No.: 10/089,910

(22) PCT Filed: Oct. 5, 2000

(86) PCT No.: PCT/EP00/09739

§ 371 (c)(1),
(2), (4) Date: Jun. 27, 2002

(87) PCT Pub. No.: WO01/27974

PCT Pub. Date: Apr. 19, 2001

(30) Foreign Application Priority Data

Oct. 8, 1999 (DE) .......................... 199 48 571

(51) Int. Cl.[7] .............................. H01L 27/108
(52) U.S. Cl. .......................... 257/306; 257/303
(58) Field of Search .................... 257/306, 303

(56) References Cited

U.S. PATENT DOCUMENTS

| | | | |
|---|---|---|---|
| 5,299,155 A | 3/1994 | Yanagi | |
| 5,371,699 A | 12/1994 | Larson | |
| 5,615,144 A | 3/1997 | Kimura et al. | |
| 5,715,189 A | 2/1998 | Asakura | |
| 5,815,428 A | 9/1998 | Tsuruda et al. | |
| 5,821,592 A | 10/1998 | Hoenigschmid et al. | |
| 5,838,036 A | 11/1998 | Mori | |
| 6,124,199 A | 9/2000 | Gambino et al. | |

FOREIGN PATENT DOCUMENTS

| | | |
|---|---|---|
| DE | 42 15 001 | 11/1992 |
| EP | 0 452 648 | 10/1991 |
| JP | 08288471 | 11/1996 |
| JP | 09082904 | 3/1997 |

OTHER PUBLICATIONS

110/Research Disclosure (Disclosed anonymously), 33426 Enhanced Density Folded Bit Line Array; 1 sheet; Feb. 1992.

*Primary Examiner*—Hoai Ho
*Assistant Examiner*—Tu-Tu Ho
(74) *Attorney, Agent, or Firm*—Schiff & Hardin & Waite

(57) ABSTRACT

The invention relates to a memory device comprising numerous memory cells, each cell comprising at least one selection transistor and one stacked capacitor and driven via word and bit lines. This memory device comprises two metallized sheets through which the bit line is led and between which the memory cell stacked capacitor is arranged.

8 Claims, 4 Drawing Sheets

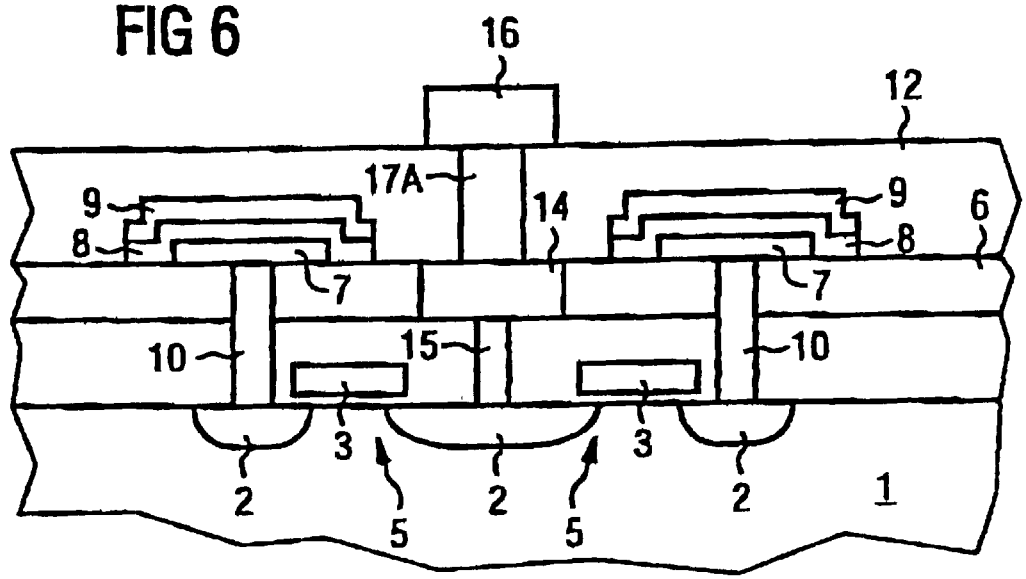
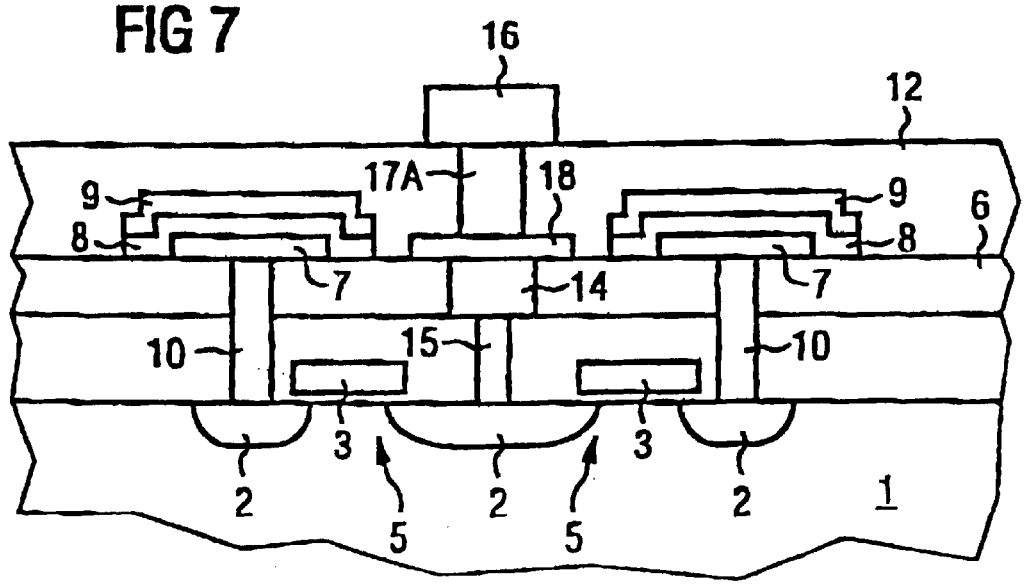

MEMORY DEVICE

BACKGROUND OF THE INVENTION

1. Field of the Invention

The present invention is directed to a memory arrangement. The present invention is particularly directed to a dynamic memory arrangement having a memory cell field composed of a plurality of memory cells that respectively comprise at least one selection transistor and a storage capacitor, and can be driven via word lines and bit lines.

2. Description of the Related Art

A dynamic memory arrangement typically comprises a plurality of memory cells. Each memory of these cells contain at least one selection transistor and a storage capacitor. These memory cells are usually arranged in rows and columns and use a plurality of bit lines and word lines in order to designationally address individual memory cells. In traditional memory arrangements, a memory cell can be selected for reading or writing by selecting a bit line and by selecting a word line. These word lines drive the selection transistor such that the selection transistor connects the storage capacitor to the bit line in an electrically conductive fashion. In this way, charge can be stored in the storage capacitor via the bit line or can be read out from the storage capacitor.

Amplifiers are usually employed for reading out the charge stored in a storage capacitor. These amplifiers are arranged at the ends of the bit lines as a rule. Since only extremely small currents flow given a read out of a selected storage capacitor, the amplifiers are usually respectively connected to a pair of bit lines. One of the bit lines then serves as a reference line for the other bit line so that the amplifier can determine information about the charge stored in the selected storage capacitor from the differences between the two bit lines. One of the bit lines is then usually placed at a high potential and the other bit line is placed at a low potential. These lines are therefore referred to as complementary bit lines. The bit lines are usually conducted in a metallization level, and their connection to the diffusion zones of the selection transistors is produced using via holes.

A large part of the outlay in the technology development of dynamic memory arrangements is comprised in generating the storage capacitor. In order to obtain an adequately high signal upon readout of the storage capacitor, the storage capacity of the storage capacitor should amount to at least 35 fF. Since the lateral expanse of the storage capacitor is becoming smaller and smaller at the same time, one is forced to generate more and more complex three-dimensional structures in order to make adequate capacitor area available.

A frequently employed embodiment for such a structure is the "stacked capacitor". Stacked capacitors exist in a number of different configurations, for example, crown stacked capacitors or hemispherical grained stack capacitors. What all of these configurations have in common, however, is that they are arranged above the silicon substrate and above the selection transistors. They thus lie in a region of the memory arrangement in which the bit lines are also arranged. Particularly when pairs of bit lines are employed, it is desirable to arrange the bit lines and the storage capacitors such that an optimally small area is consumed per memory cell and, at the same time, a cost-beneficial production of the memory cell is possible.

SUMMARY OF THE INVENTION

This object is inventively achieved by a memory arrangement comprising: a first conductive layer; an insulating layer; a second conductive layer that is separated from the first conductive layer by the insulating layer; a plurality of memory cells, the memory cells each comprising at least one selection transistor; and a stacked capacitor arranged between the first and second conductive layer; the memory arrangement further comprising word lines configured to drive a predetermined plurality of the memory cells; bit lines configured to drive the predetermined plurality of the memory cells, the bit lines comprising at least one first bit line and at least one second bit line, the first bit line and the second bit line being complementary to one another upon a readout of the memory cells, the bit lines being respectively conducted partly in the first conductive layer and the bit lines being connected from there to at least a part of the plurality of memory cells and the bit lines being respectively conducted in part in the second conductive layer, wherein a part of the first bit line or, respectively, a part of the second bit line that is conducted in the first conductive layer and a part of the first bit line or, respectively, a part of the second bit line that is conducted in the second conductive layer are connected to one another through the insulating layer via at least one first contact or, respectively, via at least one second contact; and at least one of the first contact and the second contact are arranged above an active region overlapping with a via hole to one of the memory cells. Further advantageous embodiments, properties and aspects of the present invention are described below.

Inventively, a memory arrangement having a plurality of memory cells is provided that each respectively comprise at least one selection transistor and a stacked capacitor and can be driven via word lines and bit lines. The inventive memory arrangement includes:

a) a first conductive layer b) a second conductive layer that is separated from the first conductive layer by an insulating layer, and c) at least one first bit line are provided for a respectively predetermined plurality of memory cells, this bit line being conducted partly in the first conductive layer and being connected from there to at least a part of the memory cells and being conducted in part in the second conductive layer, and d) the stacked capacitors of the memory cells are arranged between the first and the second conductive layer.

The inventive memory arrangement has the advantage that, due to the arrangement of the stacked capacitors between the first and the second conductive layer, both the aspect ratios of the via holes that connect the first conductive layer to the selection transistors as well as the aspect ratios of the "plugs" which connect the storage capacitors to the selection transistors can be kept relatively low. Furthermore, the employment of two conductive layers, for example, two metallization layers, makes it possible to realize bit line concepts that enable a dependable readout of the charge stored in the stacked capacitor even given great noise on the bit lines. Over and above this, the inventive memory arrangement makes it possible to realize memory cells whose lateral expanse is less than or equal to $7F^2$. F (Feature size) represents the smallest structure width that can be generated by the manufacturing technology employed.

According to a preferred embodiment, a second bit line is provided for the predetermined plurality of memory cells, the second bit line being partly conducted in the first conductive layer and, from this, being connected to at least a part of the memory cells and being conducted partly in the second conductive layer. It is particularly preferred when the bit lines are complementary to one another upon readout of the memory cells.

It is also preferred when the bit lines are connected to an amplifier that reads out the charge that is stored in one of the memory cells.

According to another preferred embodiment, the part of the bit line that is conducted in the first conductive layer and the parts of the first bit line that is conducted in the second conductive layer are connected to one another through the insulating layer via at least one first contact.

It is likewise preferred when the part of the second bit line that is conducted in the first conductive layer and part of the second bit line that is conducted in the second conductive layer are connected to one another via at least one second contact through the insulating layer. It is particularly preferred when the first and second contact are arranged such that the capacitances of the first and of the second bit line are essentially the same for the amplifiers.

According to another preferred embodiment, the first and/or second contact are arranged above the active region. This has the advantage that no additional chip area need be made available for these contact regions. The memory density that can be achieved is correspondingly increased.

It is particularly preferred when the first and/or second contact are arranged overlapping with a via hole to a memory cell. It is also preferred when a landing pad is arranged between the first and/or second contact and the first conductive layer and/or when the first conductive layer comprises a broadened portion in the region of the first and/or second contact.

According to another preferred embodiment, the memory cells are aligned with an angle between 10° and 60°, particularly with an angle between 20° and 40°, relative to the first and/or the second bit line.

It is also preferred when the memory cells are fashioned with a lateral expanse of less than or equal to $7F^2$.

DESCRIPTION OF THE DRAWINGS

The invention is explained in greater detail below with reference to the drawings.

FIG. 6 is a sectional side view through the inventive memory arrangement according to FIG. 4; and FIG. 7 is a sectional side view of an embodiment of the present invention modified in comparison to the embodiment shown in FIG. 6.

DETAILED DESCRIPTION OF THE INVENTION

Figure 1:
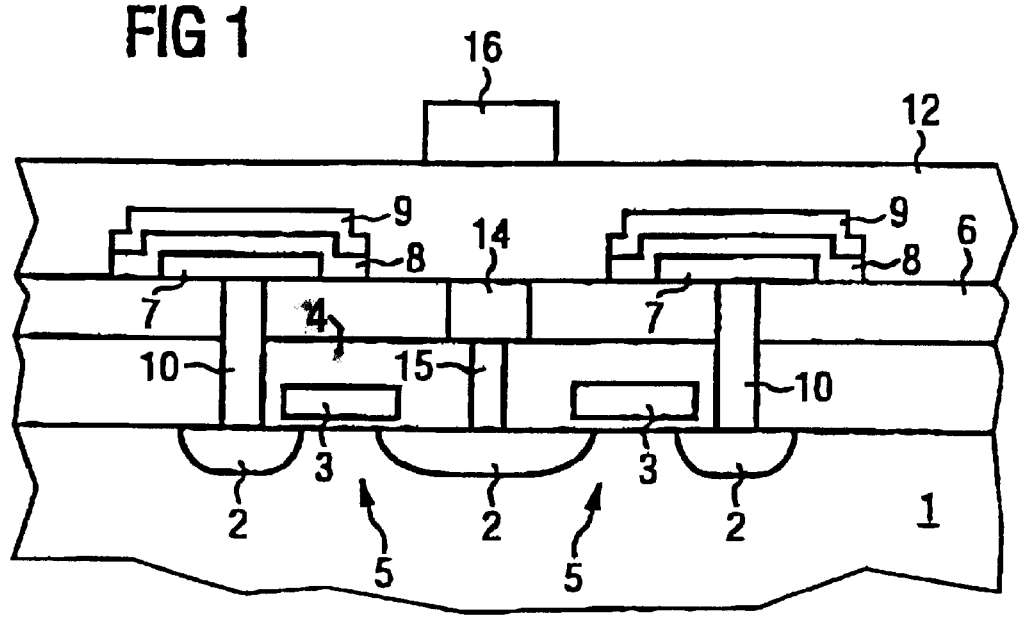
FIG. 1 is a sectional side view of a memory arrangement according to a first exemplary embodiment of the invention.

FIG. 1 shows a memory arrangement according to a first exemplary embodiment of the invention. A semiconductor substrate 1, usually silicon, having diffusion zones 2 arranged within is prepared. The diffusion zones 2 together with the gate electrodes 3 form the selection transistors 5. In this example, the selection transistors 5 of two memory cells respectively employ one diffusion zone 2 in common in order to keep the space requirement of a memory cell as low as possible. A plurality of gate electrodes 3 are electrically conductively connected to one another via word lines in the direction perpendicular to the plane of the drawing. In order to electrically insulate the various word lines or gate electrodes 3 from one another, the word lines (gate electrodes 3) are surrounded by insulating material 4, for example silicon dioxide.

In order to produce the conductive connection between the diffusion zones 2 of the memory cells and the bit lines, via holes 15 are provided in the insulating material 4, these being filled with a conductive material, for example doped silicon or tungsten. For generating a part of the bit lines, a first conductive layer 14, for example an aluminum layer, is subsequently generated on the insulating material 4. This first conductive layer 14 is subsequently structured such that the bit lines are formed. These bit lines are arranged such that they are in communication with the diffusion zones 2 of the selection transistors 5 via holes 15. An insulating layer 6 is provided for insulating the various bit lines.

The stacked capacitors are arranged on the insulating material 6, these stacked capacitors being composed of a first electrode 7, a non-conductive, dielectric or ferroelectric material 8, and a second electrode 9. The selection transistors 5 of each and every memory cell are respectively electrically conductively connected to the first electrode 7 of the stacked capacitor via a "plug" 10. This plug 10 is usually formed of doped polysilicon. An insulating layer 12 is then applied onto the upper electrode 9. For example, a $SiO_2$ layer can be employed as insulating layer, this being deposited with a CVD method.

For generating the further part of the bit lines, a second conductive layer 16, for example an aluminum layer, is subsequently generated on the insulating material 12. This second conductive layer 16 is subsequently structured such that bit lines are again formed.

Figure 2:
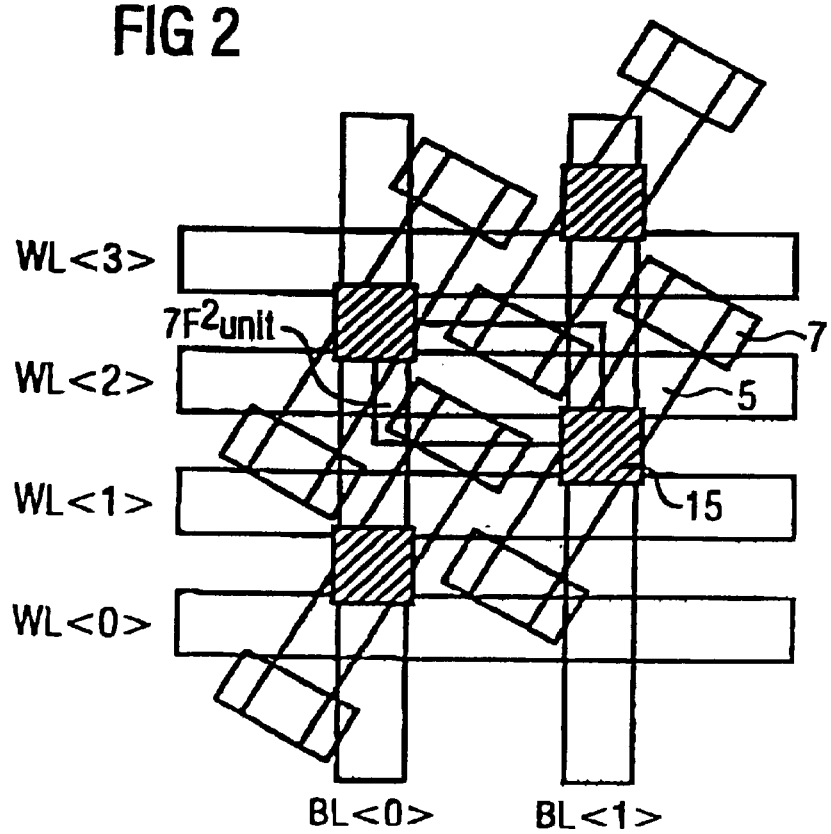
FIG. 2 is a pictorial plan view onto an inventive memory arrangement.

FIG. 2 shows a schematic plan view onto an inventive memory arrangement in which eight memory cells are illustrated—only the lower electrode 7 of the stacked capacitors is shown. The memory cells are connected via the via holes 15 to the bit lines BL<0> and BL<1>. The bit lines BL<0> and BL<1> proceed from top to bottom in FIG. 2. Only that part of the bit lines BL<0> and BL<1> greater than shown in FIG. 2 is the part that proceeds in the first conductive layer 14 under the lower electrode 7 of the stacked capacitors. The bit line that is respectively complementary to the illustrated bit lines BL<0> and BL<1> proceeds directly above the bit lines BL<0> and BL<1> (above the plane of the drawing, not shown).

The word lines WL<0> through WL<3>, which control the selection transistors of the memory cells, proceed perpendicular to the bit lines BL<0> and BL<1>. As can be seen from FIG. 2, the memory cells are aligned with an angle of approximately 30° relative to the bit lines BL<0> and BL<1>. As a result of this alignment of the memory cells, the memory cells can be more densely arranged, resulting in an increase of the storage capacity with a given chip area. The hatched region in the middle of FIG. 2 shows the expanse of the $7F^2$ unit generated in this way.

If only the bit lines BL<0> and BL<1> were conducted in the first conductive layer 14, and the complementary bit lines were conducted in the conductive layer 16 lying above, then this would result in the capacitances and the resistances of the bit lines BL<0> and BL<1> and their complementary bit lines noticeably differing, and would further result in a negatively influence of the measurement of the amplifiers.

In order to avoid this, the bit lines BL<0> and BL<1> and the corresponding, complementary bit lines bBL<0> and bBL<1> (see FIG. 3) are conducted both in the lower as well as in the upper conductive layer. According to FIG. 3, the bit line BL<1> is conducted in the lower conductive layer from the left side of the drawing up to the line 23. A contact is prepared between the line 23 and the line 24 in order to connect the bit lines BL<1> to the upper conductive layer. From the line 24 to the line 27, the bit lines BL<1> are conducted in the upper conductive layer (metallization level).

The complementary bit line bBL<1> is conducted in the upper conductive layer (metallization level) from the left side of the drawing up to the line 23. A further contact is prepared between the line 23 and the line 24, this connecting the bit line Bbl<1> to the lower conductive layer (metallization level). Between the line 24 and the line 27, the bit line bBL<1> is conducted in the lower conductive layer (metallization level). The bit line BL<1> or bBL<1> is respectively connected to the memory cells that are conducted in the lower conductive layer (metallization level). This assures that the capacitances and the resistances of the two bit lines BL<1> and bBL<1> are of essentially the same size.

Figure 3:
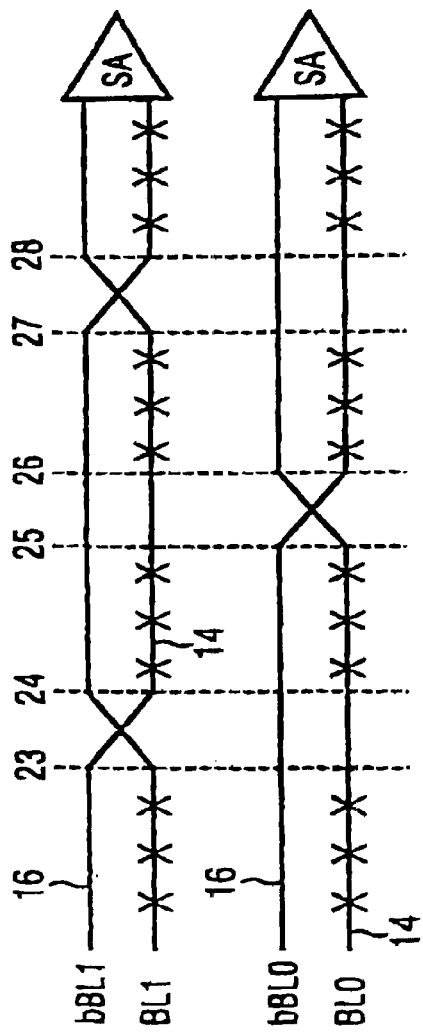
FIG. 3 is a schematic course of the bit lines along a row of memory cells.

The bit lines BL<0> and bBL<0>, which are shown in the lower part of FIG. 3, behave in a similar way. The transition of the two bit lines BL<0> and bBL<0> ensues between lines 25 and 26. Respective amplifiers SA (sense amplifier) are arranged at the right-hand end of the bit lines BL<1> and bBL<1> as well as BL<0> and bBL<0>, these amplifiers SA registering the charge readout from the memory cells. As can be seen from FIG. 3, separate zones between the lines 24 and 25, 26 and 27 as well as 27 and 28 are provided in this embodiment of the invention for the contacts between the upper and the lower conductive layer. No memory cells are provided in these zones.

Figure 4:
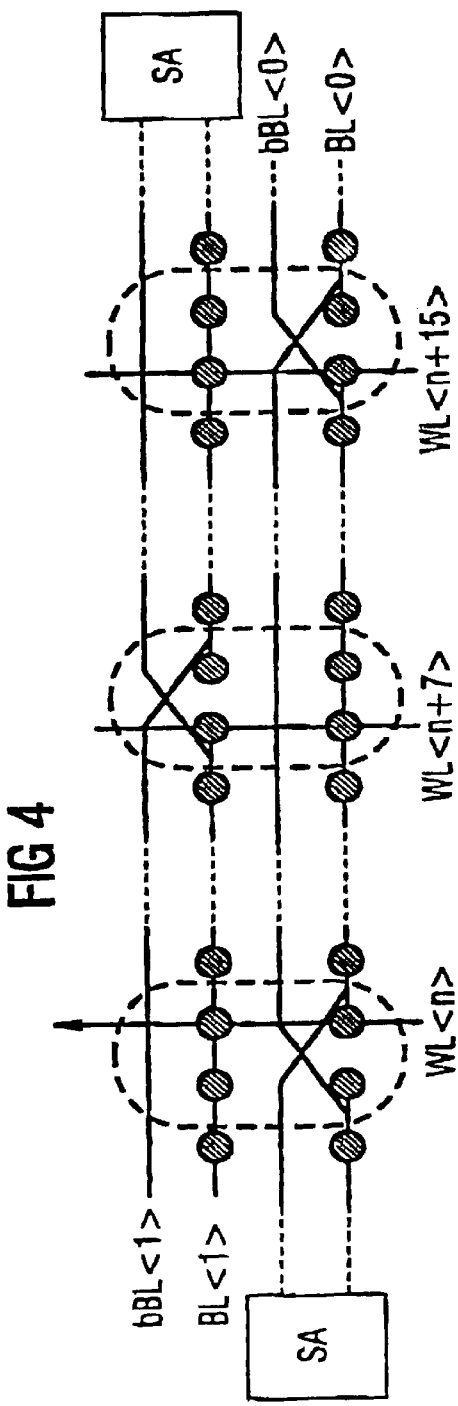
FIG. 4 is a schematic course of the bit lines along a row of memory cells according to another embodiment of the present invention.

For further enhancing the storage density, FIG. 4 shows another embodiment of the present invention. The bit lines BL<0> and BL<1> and the corresponding, complementary bit lines bBL<0> and bBL<1> are again conducted both in the lower as well as in the upper conductive layer. In contrast to the embodiment shown in FIG. 3, however, the contacts that connect the upper and the lower conductive layer to one another are now directly offered via active zones, i.e., in the region of the memory cells. Accordingly, zones at which only contacts are provided between the upper and lower conductive layer (see FIG. 3) are avoided.

Figure 5:
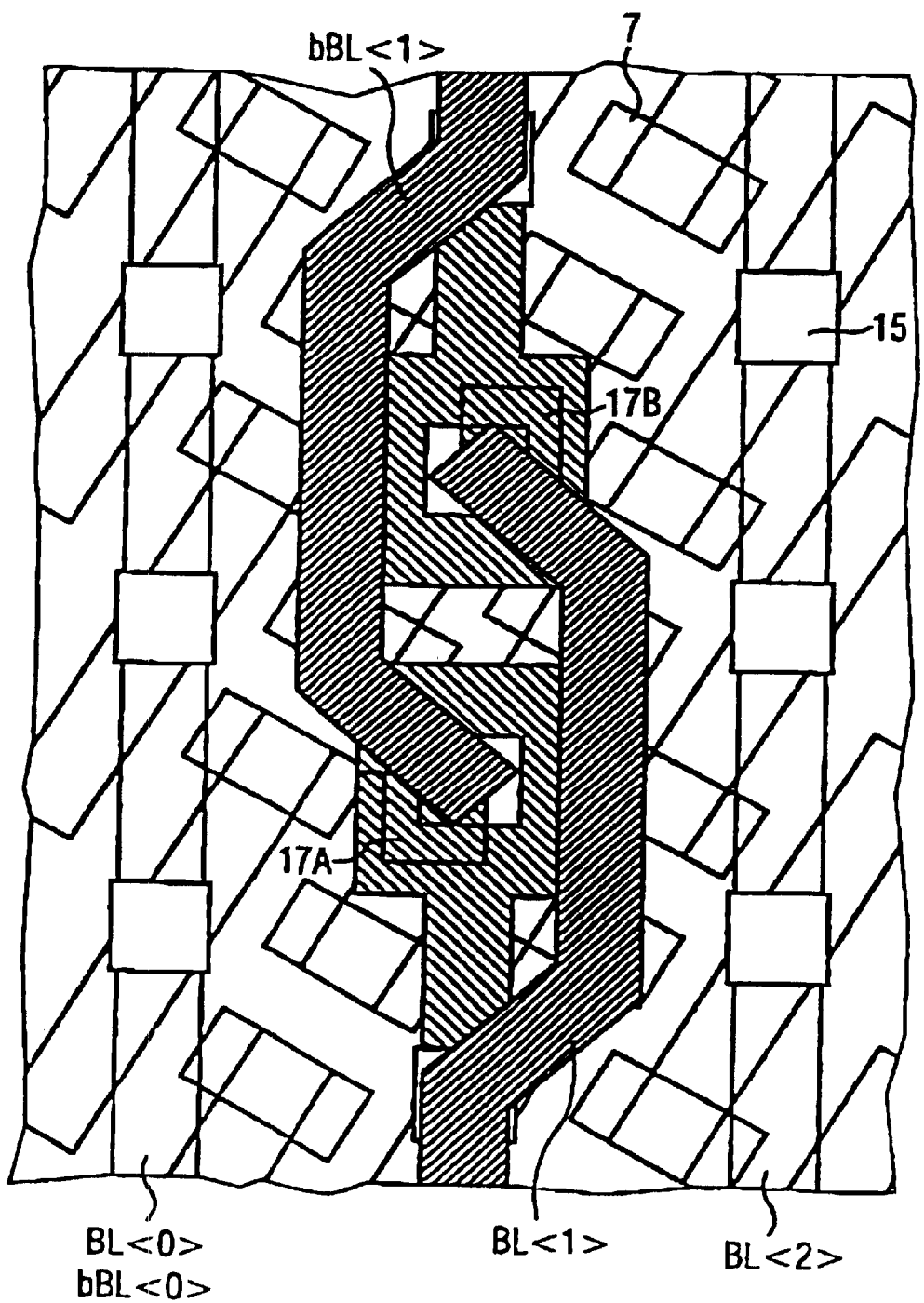
FIG. 5 is a pictorial plan view onto the inventive memory arrangement according to FIG. 4.

FIG. 5 shows a schematic plan view onto the inventive memory arrangement according to FIG. 4. FIG. 5 illustrates a row of memory cells in which only the lower electrode 7 of the stacked capacitors is shown. The memory cells are connected to the bit lines BL<0>, BL<1> and BL<2> via the contact holes 15. The bit lines BL<0>, BL<1> and BL<2> proceed from top to bottom in FIG. 5. In contrast to FIG. 2, the bit lines bBL<0>, bBL<1> and bBL<2> complementary to the bit lines BL<0>, BL<1> and BL<2> are shown in FIG. 5.

Word lines that drive the selection transistors of the memory cells have not been shown in FIG. 5 for reasons of clarity. As can be seen from FIG. 5, the memory cells are again aligned at an angle of approximately 30° relative to the bit lines BL<0>, BL<1>, BL<2>, permitting the memory cells to be more densely arranged and resulting in an increase in storage capacity for a given chip area.

The portion of the bit lines BL<0>, BL<1> and BL<2> or of the complementary bit lines bBL<0>, bBL<1> and bBL<2> shown in FIG. 5 is selected such that two contacts 17A and 17B (also see FIG. 6) are provided for bit lines BL<1> and bBL<1> so that the bit lines BL<1> and bBL<1> can switch between the upper and the lower conductive layer. At the lower edge of FIG. 5, the bit line BL<1> is conducted in the upper conductive layer. In the upper conductive layer, the bit line BL<1> is conducted past the contact 17A at the right side and then encounters the contact 17B. The bit line BL<1> is conducted to the lower conductive layer by the contact 17B, this lower conductive layer being connected at this location to two memory cells via a via hole. Following the contact 17B, the bit line BL<1> is conducted up to the upper edge of FIG. 5 in the lower conductive layer.

At the upper edge of FIG. 5, the bit line bBL<1> complementary to the bit line BL<1> is conducted in the upper conductive layer. In this upper conductive layer, the bit line bBL<1> is conducted passed the contact 17B at the left side and then encounters the contact 17A. The bit line bBL<1> is conducted by the contact 17A to the lower conductive layer that is connected at this location to two memory cells via a via hole. Following the contact 17A, the bit line bBL<1> is conducted in the lower conductive layer up to the lower edge of FIG. 5.

In a preferred embodiment, the contacts 17A, 17B and the via holes 15 are arranged overlapping in the plan view. Extremely small memory cells can be realized in this way.

FIG. 6 shows the environment of the contact 17A in section. The situation shown in FIG. 6 differs from the situation shown in FIG. 1 in that a contact 17A is provided between the upper conductive layer 16 under the lower conductive layer 14. All further elements shown in FIG. 6 correspond to the element shown in FIG. 1 and are therefore not explained in greater detail.

In order to assure that a contact will be located between the lower and the upper conductive layer (even given the presence of alignment errors in the manufacture of the memory arrangement), the lower conductive layer 14 is designed to be broader in the region of the contact 17. This can also be seen from FIG. 5.

Instead of designing the lower conductive layer itself broader in the region of the contact 17A, an additional landing pad 18 can also be provided. This landing pad, for example, can be fabricated of the material of the lower electrode 7 or of the material of the upper electrode 9.

The inventive memory arrangement has the advantage that, due to the arrangement of stacked capacitors between the first and the second conductive layer, both the aspect ratios of the via holes 15 that connect the first conductive layer 14 to the selection transistors 5 as well as the aspect ratios the "plugs" 10 that connect the storage capacitors to the selection transistors 5 can be kept relatively low. Over and above this, advanced bit line concepts can be realized in extremely small memory cells.

The description of specific embodiments above is provided for the purposes of promoting an understanding of the principles of the invention. However, no limitation of the scope of the invention is intended by this specific language, and the invention should be construed to encompass all embodiments that would normally occur to one of ordinary skill in the art. For the sake of brevity, conventional electronics and other functional aspects of the systems (and components of the individual operating components of the systems) may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical memory device. Moreover, no item or component is essential to the practice of the invention unless the element is specifically described as "essential" or "critical".

List of Reference Characters 1 silicon substrate
2 diffusion zone
3 gate electrode
4 SiO$_2$ layer
5 selection transistor
6 SiO$_2$ layer
7 lower electrode
8 ferro-electric/dielectric
9 upper electrode
10 plug
12 SiO$_2$ layer
14 aluminum layer
15 via hole
16 aluminum layer
17A contact
17B contact
18 landing pad
23 line
24 line
25 line
26 line
27 line
28 line

What is claimed is:

1. A memory arrangement comprising:
a first conductive layer;
an insulating layer;
a second conductive layer that is separated from the first conductive layer by the insulating layer;
a plurality of memory cells, the memory cells each comprising:
at least one selection transistor; and
a stacked capacitor arranged between the first and second conductive layer;
the memory arrangement further comprising
word lines configured to drive a predetermined plurality of the memory cells;
bit lines configured to drive the predetermined plurality of the memory cells,
the bit lines comprising at least one first bit line and at least one second bit line, the first bit line and the second bit line being complementary to one another upon a readout of the memory cells, the bit lines being respectively conducted partly in the first conductive layer and the bit lines being connected from there to at least a part of the plurality of memory cells and the bit lines being respectively conducted in part in the second conductive layer, wherein
a part of the first bit line or, respectively, a part of the second bit line that is conducted in the first conductive layer and a part of the first bit line or, respectively, a part of the second bit line that is conducted in the second conductive layer are connected to one another through the insulating layer via at least one first contact or, respectively, via at least one second contact; and
at least one of the first contact and the second contact are arranged above an active region overlapping with a via hole to one of the memory cells.

2. A memory arrangement according to claim 1, further comprising:
an amplifier connected to the bit lines, the an amplifier being configured to read out a charge that is stored in at least one of the memory cells.

3. A memory arrangement according to claim 2, wherein the first contact and the second contact are arranged such that capacitances of the first and of the second bit line are essentially the same for the amplifier.

4. A memory arrangement according to claim 1, further comprising:
a landing pad arranged between at least one of the first and second contact and the first conductive layer.

5. A memory arrangement according to claim 1, wherein the first conductive layer comprises a broadened portion in a region of at least one of the first contact and the second contact.

6. A memory arrangement according to claim 1, wherein the memory cells are aligned with an angle between 10° and 60° relative to at least one of the first and the second bit line.

7. A memory arrangement according to claim 6, wherein the memory cells are aligned an angle between 20° and 40° relative to at least one of the first and the second bit line.

8. A memory arrangement according to claim 1, wherein the memory cells comprise a lateral expanse of less than or equal to 7F$^2$.

* * * * *